US009973223B2

United States Patent
Petrovic

(10) Patent No.: US 9,973,223 B2
(45) Date of Patent: *May 15, 2018

(54) METHOD AND APPARATUS FOR ADAPTIVE AUTOMATIC GAIN CONTROL

(71) Applicant: ENTROPIC COMMUNICATIONS, LLC., Carlsbad, CA (US)

(72) Inventor: Branislav Petrovic, La Jolla, CA (US)

(73) Assignee: Entropic Communications, LLC, Carlsbad, CA (US)

(*) Notice: Subject to any disclaimer, the term of this patent is extended or adjusted under 35 U.S.C. 154(b) by 0 days. days.

This patent is subject to a terminal disclaimer.

(21) Appl. No.: 15/303,355

(22) PCT Filed: Apr. 10, 2015

(86) PCT No.: PCT/US2015/025252
§ 371 (c)(1),
(2) Date: Oct. 11, 2016

(87) PCT Pub. No.: WO2015/157604
PCT Pub. Date: Oct. 15, 2015

(65) Prior Publication Data
US 2017/0033816 A1  Feb. 2, 2017

Related U.S. Application Data

(63) Continuation of application No. 14/271,060, filed on May 6, 2014, now Pat. No. 9,124,234.
(Continued)

(51) Int. Cl.
*H04L 27/08* (2006.01)
*H04B 1/10* (2006.01)
(Continued)

(52) U.S. Cl.
CPC ......... *H04B 1/1027* (2013.01); *H03G 3/3052* (2013.01); *H03G 3/3078* (2013.01); *H04B 17/336* (2015.01); *H04L 5/0046* (2013.01)

(58) Field of Classification Search
CPC .. H04B 1/1027; H04B 17/336; H04B 17/006; H04B 17/005; H03G 3/3052;
(Continued)

(56) References Cited

U.S. PATENT DOCUMENTS 7,298,772 B1 * 11/2007 Neerudu ............. H04L 27/2662
375/136
7,412,000 B1 * 8/2008 Sailaja ............... H04B 1/71057
375/229
(Continued)

FOREIGN PATENT DOCUMENTS

WO  2008067344  6/2008

OTHER PUBLICATIONS

International Preliminary Report on Patentability corresponding to International Patent Application No. PCT/US2015/025252, dated Oct. 20, 2016.
(Continued)

*Primary Examiner* — Juan A Torres
(74) *Attorney, Agent, or Firm* — McAndrews Held & Malloy

(57) ABSTRACT

Systems and methods for dynamically adjusting the gain in a receiver front end to have a desired amount of headroom, based upon a measurement of the signal to noise ratio (SNR) of the output of a digital to analog converter and the amount of degradation to the SNR due to previous adjustments to the gain.

20 Claims, 6 Drawing Sheets

Related U.S. Application Data

(60) Provisional application No. 61/978,642, filed on Apr. 11, 2014.

(51) Int. Cl.
*H03G 3/30* (2006.01)
*H04B 17/336* (2015.01)
*H04L 5/00* (2006.01)

(58) Field of Classification Search
CPC ....... H03G 3/3078; H04L 5/0046; H04L 1/20; H04L 1/0009; H04L 27/2647
USPC .................................................. 375/345, 227
See application file for complete search history.

(56) References Cited

U.S. PATENT DOCUMENTS

| | | | |
|---|---|---|---|
| 2003/0142768 A1* | 7/2003 | Sintonen | H04B 1/0003 375/345 |
| 2003/0181178 A1 | 9/2003 | Zerod et al. | |
| 2009/0079611 A1* | 3/2009 | Hwang | H03M 1/18 341/155 |
| 2010/0046679 A1* | 2/2010 | Kajakine | H03G 3/3078 375/345 |
| 2010/0006762 A1 | 3/2010 | Sankabathula et al. | |
| 2010/0067624 A1 | 3/2010 | Sankabathula et al. | |
| 2010/0119019 A1* | 5/2010 | Ito | H04B 1/1081 375/344 |
| 2011/0059711 A1 | 3/2011 | Bjork | |
| 2011/0274223 A1* | 11/2011 | Agarwal | H03G 3/3078 375/345 |
| 2012/0257694 A1* | 10/2012 | Balakrishnan | H04B 1/1646 375/340 |
| 2013/0279556 A1* | 10/2013 | Seller | H03G 3/3068 375/227 |
| 2014/0340153 A1* | 11/2014 | Wilhelmsson | H03G 3/3078 330/278 |

OTHER PUBLICATIONS

International Search Report and Written Opinion corresponding to International Patent Application No. PCT/US2015/025252, dated Jul. 13, 2015.

International Preliminary Report on Patentability correspnding to International Patent Application No. PCT/US2015/025252, dated Oct. 20, 2016.

International Search Report and Written Opinion corresponding to International Patent Application No. PCT/us/2015/025252, dated Jul. 13, 2015.

* cited by examiner

METHOD AND APPARATUS FOR ADAPTIVE AUTOMATIC GAIN CONTROL

This application is the nationalization of PCT application PCT/US2015/025252, which claims priority to U.S. application Ser. No. 14/271,060 filed on Nov. 4, 2014, now U.S. Pat. No. 9,124,234, which makes reference to and claims priority to U.S. Provisional Application Ser. No. 61/978,642 filed on Apr. 4, 2014. Each of the above stated applications is hereby incorporated herein by reference in its entirety.

TECHNICAL FIELD

The disclosed method and apparatus relate to broadband receivers, and more particularly to systems for efficiently receiving broadband signals with large dynamic range.

BACKGROUND

Designers of broadband receivers face several challenges today. One such challenge is presented by the very nature of broadband receivers. That is, in many of the communications systems of today, receivers are required to digitize incoming signals over a broad frequency range. These signals may have a very large dynamic range (i.e., power levels can vary greatly). For the purpose of this discussion, the term "power level" is used broadly to refer to either the amount of power in a particular frequency band (i.e., power density) or the amount of power over the entire band used by the particular received signal (i.e., total signal power). In addition, a "signal" is defined as the energy within a frequency band that is used to represent information (i.e., "content") being communicated from a transmission source to the receiver. Accordingly, a receiver may receive several signals, some such signals from the same transmission source, each such signal using a different frequency band, and some such signals from different transmission sources using different frequency bands.

FIG. 1 is a simplified block diagram of a typical receiver 100. A low noise amplifier (LNA) 102 initially receives the incoming signals. The LNA 102 amplifies the signals. The output from the LNA 102 is the coupled to an input of an automatic gain control (AGC) circuit 103. The AGC circuit 103 attempts to ensure that the power of the incoming signal remains essentially constant for incoming signals of varying power levels. It is common today for such AGC circuits to drive the incoming signal to the highest level possible without causing distortion due to clipping of the signal.

The output of the ACG circuit 103 is coupled to the input of a set of analog filters 104. These analog filters 104 ensure that energy outside the desired frequency band is removed before further processing of the signals. The filtered signals are then output from the analog filters 104 to an analog to digital converter (ADC) 106. The ADC 106 takes the received filtered analog signals and generates a digital representation of these received signals. The digital representation of the analog input takes the form of a series of digital values that each indicate the amplitude of the analog signal at a particular point in time. The combination of the LNA 102, the AGC circuit 103, the analog filters 104 and the ADC 106 comprise the receiver front end 109.

The digital output from the ADC 106 is then coupled to a Receive (RX) processor 108. The Receiver Processor 108 performs whatever processing is desired for the received signals. For example, the Receiver Processor 108 might process the signals to extract viewable video content and prepare that content for display on a monitor (not shown).

One problem that arises comes from the fact that unexpected bursts of interference can occur that will drive the output of the AGC to a level that will exceed the capability of the ADC. That is, the output of the ADC will be compressed, since the ADC will hit full scale before the signal at the input of the ADC has reached its highest level. Accordingly, the ADC will output the same erroneous value (i.e., the full scale value) for each input above that level that initially reaches the full scale value. This is commonly referred to as "clipping" and causes errors in data transmission. For example in networks that conform to the well-known Multimedia of Coax Alliance (MoCA) standard, a burst interference that drives the ADC into clipping will result in data packet errors. Such a burst interference may be caused by adjacent channel activity or off-air interference from cell or LTE (Long Term Evolution) phones.

The AGC is designed to drive the input to the ADC 106 as close to full scale as possible. In some cases, headroom is designed into the ACG circuit 103 to ensure that there is some safety margin (i.e., a "backoff" or "headroom") between the full scale value at the output of the ADC 106 and the value that is output by the strongest received signal. Most signals have the peak power exceeding the average power. The minimum headroom needs to be sufficient to accommodate the peak power. Typically, a fixed amount of backoff is provided to deal with the worst case, to account for unit to unit variability, temperature and other factors. Therefore, the AGC provides less gain than is desirable in some cases, but more gain in others. If the selection of what is "worst case" is made too aggressively, then it is more likely that from time to time, an interfering signal will cause clipping in the ADC 106. However, if a more conservative approach is taken, the likelihood is that for the majority of the time, the front end will not be providing as much gain as would otherwise be desired.

In some cases, this can be dealt with by adjusting the modulation that is used and thus increasing the signal to noise ratio margin and so reducing the impact when interference is present. However, in many systems in use today, it is not possible to control the modulation sufficient rapidly to account for short bursts of interference. Furthermore, in some cases, the adjustments to the modulation are made based on an analysis of the signals that are made at discrete times. Interference might not be present during those discrete times. Therefore, the modulation will not be adjusted to account for the interference.

Further complicating the matter, in some cases receiver front end circuits use a variable power supply. In such cases, the amount of gain that is appropriate for one power supply output level will not be appropriate for another power supply output level.

Accordingly, there is presently a need for an receiver front end that can receive signals with a very large dynamic range and digitize them without compressing the large signals, while still maintaining a high resolution for weaker signals in the face of intermittent bursts of noise.

SUMMARY

Various embodiments of the disclosed method and apparatus for receiving broadband content are presented. Some of these embodiments are directed toward systems and methods for establishing the proper level of gain adjustment within the front end of a receiver.

In accordance with the disclosed method and apparatus, a measure of the signal to noise ratio (SNR) is made. Alternatively, other similar qualitative measurements can be made in place of the SNR measurement. If the measured SNR is above a predetermined minimum value, then the gain in the AGC is reduced. Another measure of the SNR is then made. If the SNR remains above the minimum value, then the difference between the SNR prior to the gain adjustment and the SNR after the gain adjustment is calculated. This difference is referred to as the "delta SNR". If the delta SNR is below an allowable SNR degradation value, then the gain is again reduced by an incremental amount. This process continues until the SNR either drops below the minimum acceptable value or the delta SNR exceeds the acceptable amount.

BRIEF DESCRIPTION OF THE DRAWINGS

The disclosed method and apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

The figures are not intended to be exhaustive or to limit the claimed invention to the precise form disclosed. It should be understood that the disclosed method and apparatus can be practiced with modification and alteration, and that the invention should be limited only by the claims and the equivalents thereof.

DETAILED DESCRIPTION

In one example of the disclosed method and apparatus, a broadband receiver uses an automatic gain control (AGC) control module to control the gain of an AGC module within the front end of the receiver.

Figure 1:
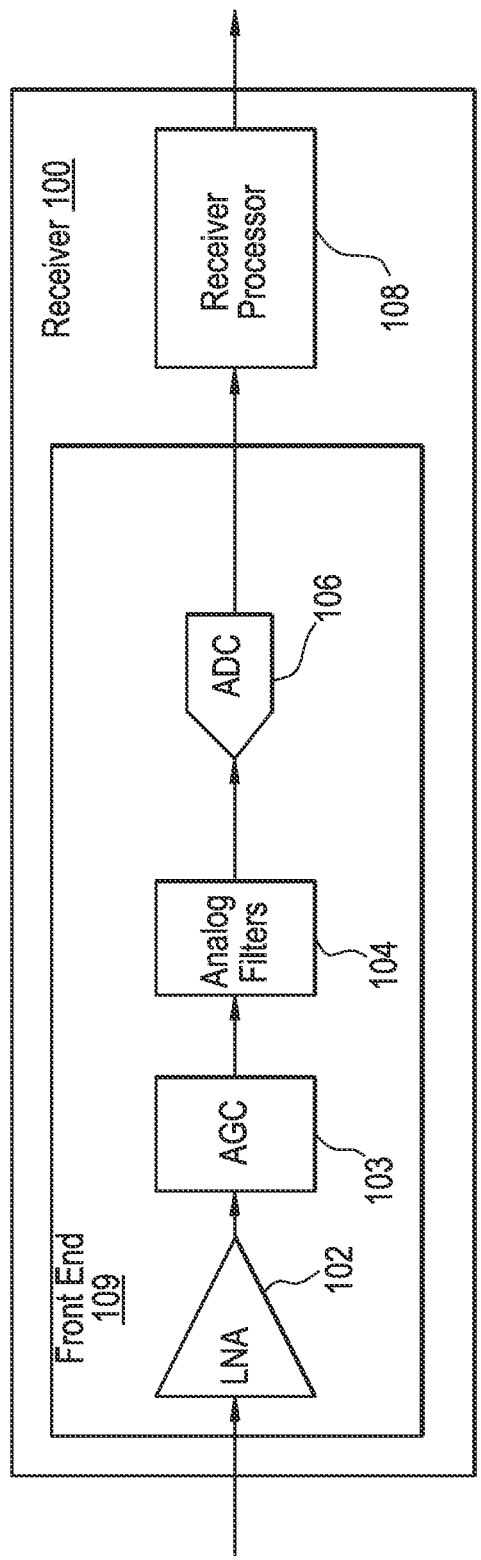
FIG. 1 is a simplified block diagram of a typical receiver.
Figure 2:
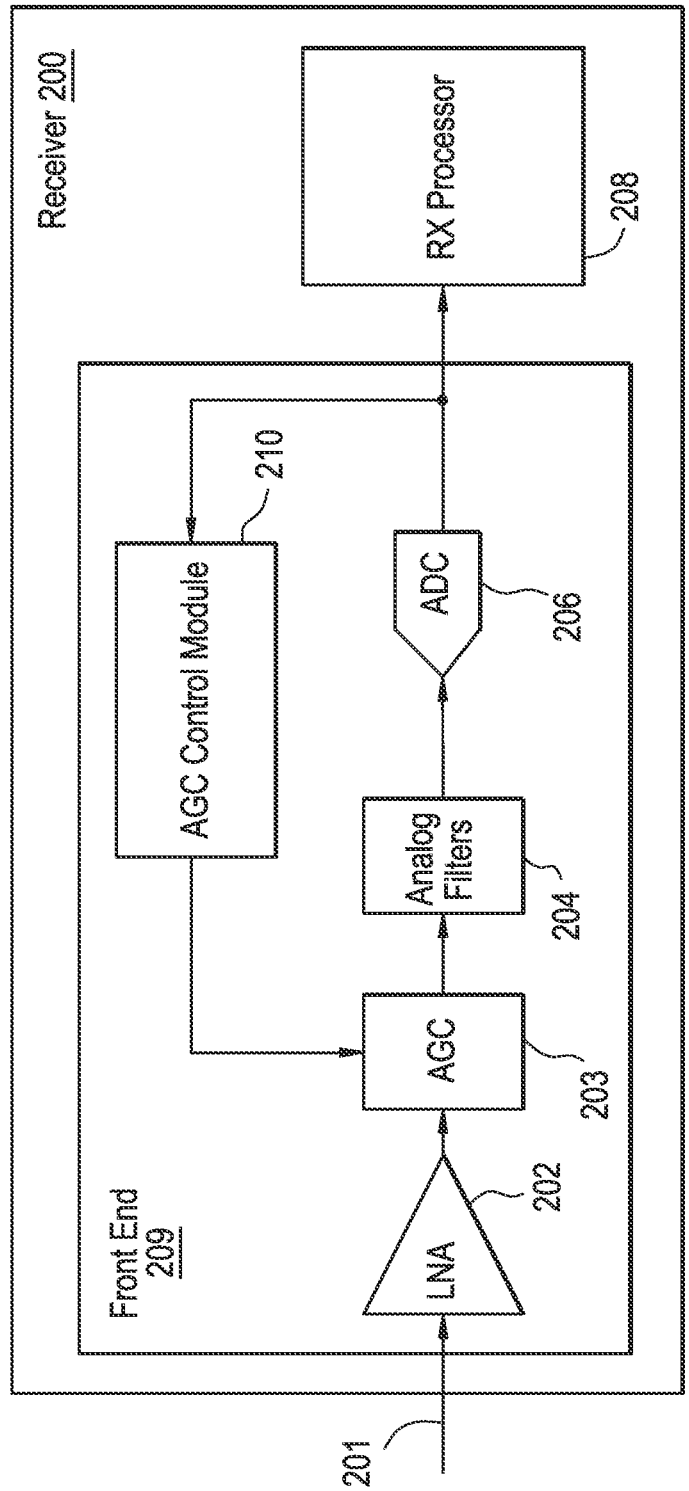
FIG. 2 is a simplified block diagram of a receiver in accordance with one embodiment of the disclosed method and apparatus.

FIG. 2 is a simplified block diagram of a receiver 200 comprising a receiver processor 208 and a receiver front end 209. The receiver front end 209 comprises a low noise amplifier (LNA) 202, an AGC Module 203, an analog filter module 204, an analog to digital converter (ADC) 206 and an AGC Control Module 210. An input signal 201 is coupled to the input of the LNA 202. The output of the LNA 202 is coupled to the input of the AGC Module 203. The AGC Module 203 provides variable gain to the signal output from the LNA 202. The gain controlled output from the AGC Module 203 is then coupled to the input of the analog filter module 204. The analog filter module 204 removes signals that are outside of the frequency range of interest. The output from the analog filter module 204 is then coupled to the input of the ADC 206. The ADC 206 digitizes the analog signal output from the filter module 204. The digitized signal can then be processed by the Receiver Processor 208. The Receiver Processor 208 provides decoding, demodulating, video processing, etc. It will be understood by those skilled in the art that the type of processing that the Receiver Processor 208 performs will depend upon the type of receiver 200.

The AGC Control Module 210 receives information from the Receiver Processor 208. The received information allows the AGC Control Module 210 to make informed decisions regarding the amount of gain to be added to input signal 201 to ensure that the ADC 206 is used most efficiently and effectively.

Figure 3:
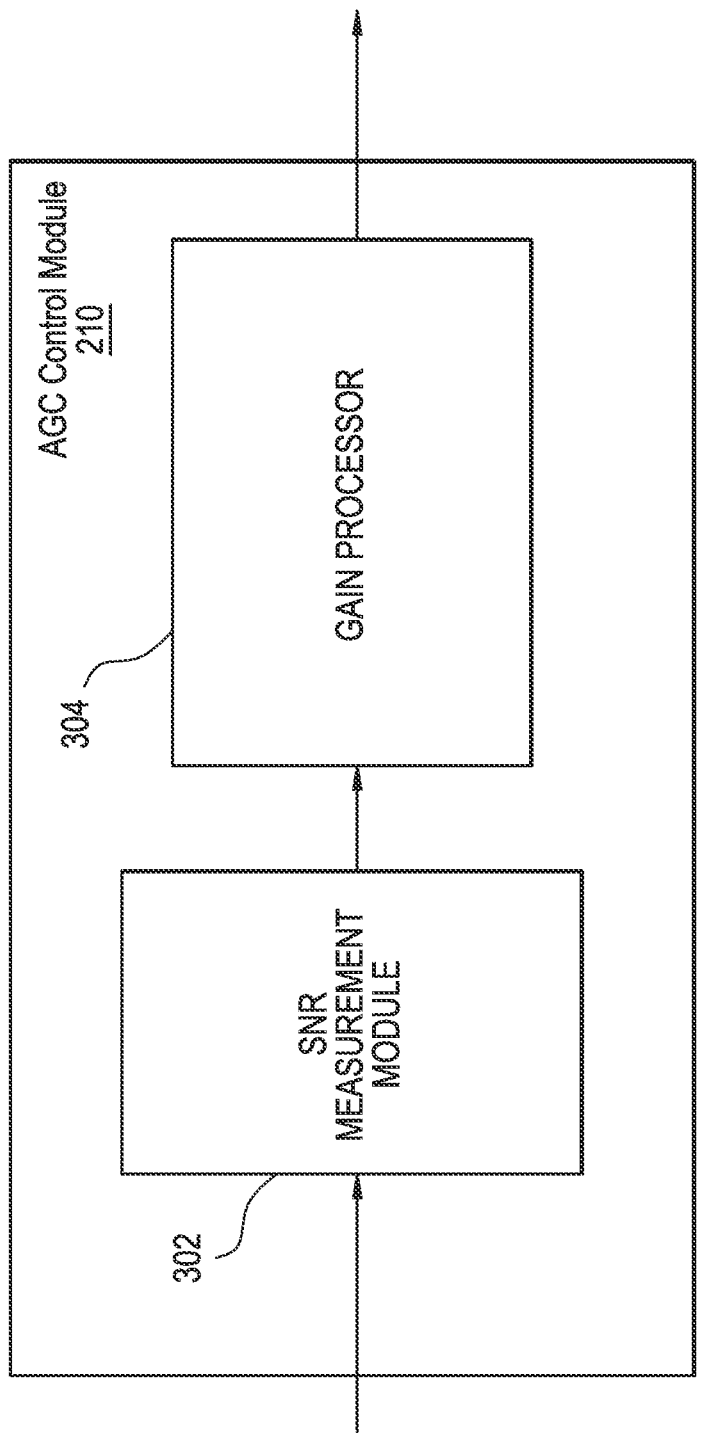
FIG. 3 is a simplified block diagram of the AGC Control Module in accordance with one embodiment of the presently disclosed method and apparatus.
Figure 4:
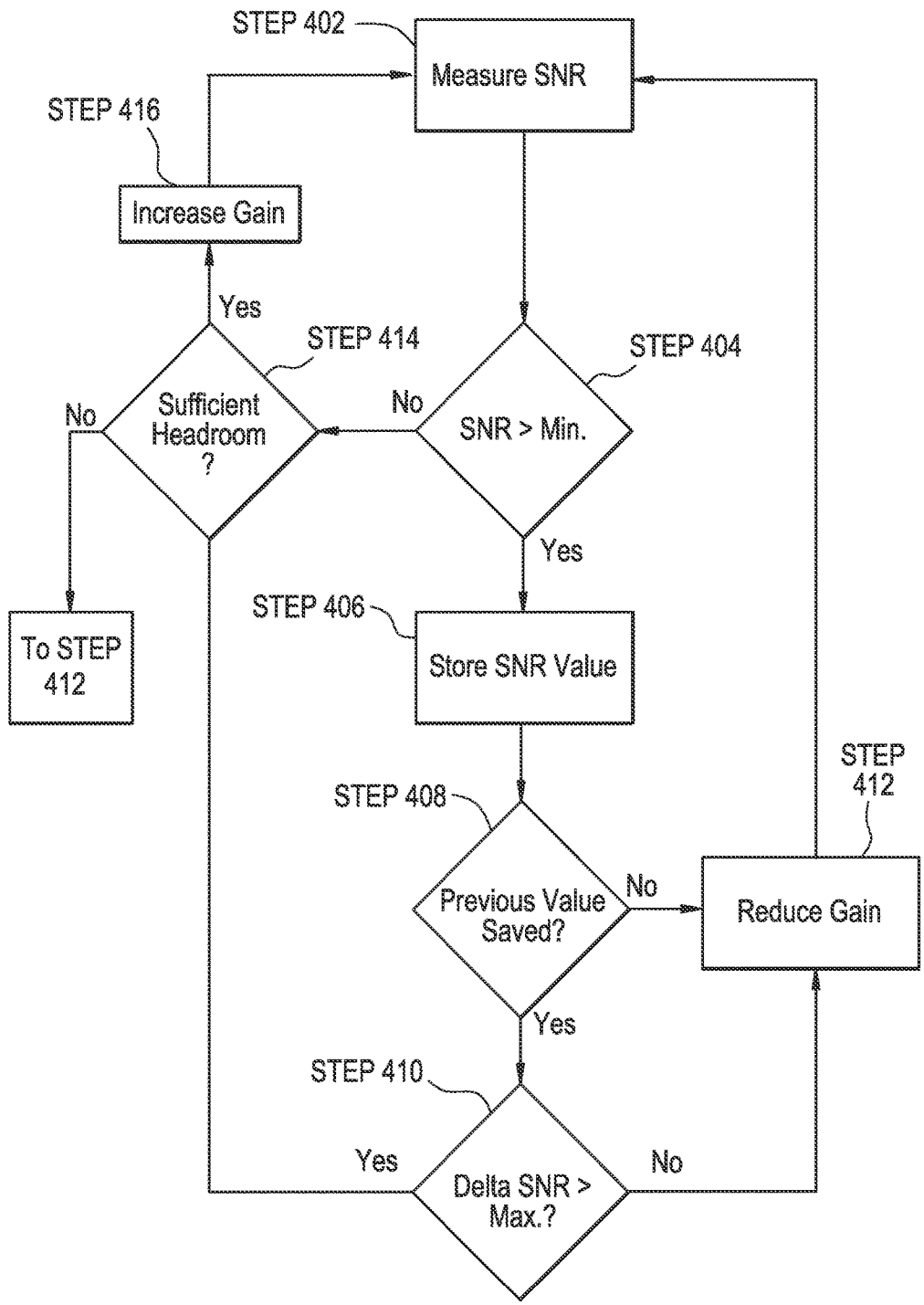
FIG. 4 is a flow diagram of the functions performed by the combination of the AGC Control Module and the AGC Module of one embodiment of the presently disclosed method and apparatus.

FIG. 3 is a simplified block diagram of the AGC Control Module 210. FIG. 4 is a flow diagram of the functions performed by the combination of the AGC Control Module 210 and the AGC Module 203. The AGC Control Module 210 includes a signal to noise ratio (SNR) Measurement Module 302 and a Gain Processor 304. The SNR Measurement Module 302 receives information from the Receiver Processor 208 from which the SNR Measurement Module 302 can determine the SNR of the received signal (STEP 402). Alternatively, the Receiver Processor 208 provides the SNR of the received signal 201 directly to the AGC Control Module 210. In that case, the SNR Measurement Module 302 may not be required. Accordingly, the Gain Processor 304 is directly coupled to the Receiver Processor 208. In either case, the Gain Processor 304 receives a measure of the SNR of the input signal 201. The Gain Processor 304 determines whether the SNR value is greater than a minimum SNR value (STEP 404). The minimum SNR value can be determined based upon the minimum value needed to decode information encoded on the input signal 201 with the required (or desired) accuracy.

If the SNR is above the minimum required SNR, the Gain Processor 304 stores the value (STEP 406). If this is the first time through the process, then there will not be a previously saved SNR value. (STEP 408). If that is the case, then the Gain Processor 304 sends a command to the AGC Module 203 to reduce the gain provided by the AGC Module 203 in a relatively small incremental step. If there was a previously saved value (STEP 408), then the difference between the saved value and the current value is calculated. This difference is referred to as the "delta SRN". If the delta SNR is smaller than a "maximum delta SNR" value (STEP 410), then the gain is reduced (STEP 412). If not, then in one embodiment of the disclosed method and apparatus, the gain is increased (STEP 414). Alternatively, the gain remains unchanged if the delta SNR is greater than the maximum delta SRN value.

In one alternative embodiment, changes to the gain may cease if the output from the ADC 206 falls outside a desired range (i.e., either the amount of headroom falls below a desired minimum or the level of the ADC 206 output falls below a desired minimum).

It can be seen that this process will result in the gain being held at the point at which the SNR is very near the minimum SNR, or the delta SNR is very near the maximum delta SNR. In accordance with one embodiment, the adjustments to the gain used to increase the gain are smaller than the adjustments used to reduce the gain. In an alternative embodiment, the adjustments are the same size for both reducing and increasing the gain. In yet another embodiment, the increase in the gain is larger than the reduction in the gain. In yet another embodiment, the changes in the gain are non-monotonic to reduce the likelihood of divergence or oscillation. In yet another embodiment, a check is made to ensure that there is sufficient headroom between the maximum amplitude output from the analog filter module 204 and the amplitude that cause the ADC to output a full scale value.

Figure 5:
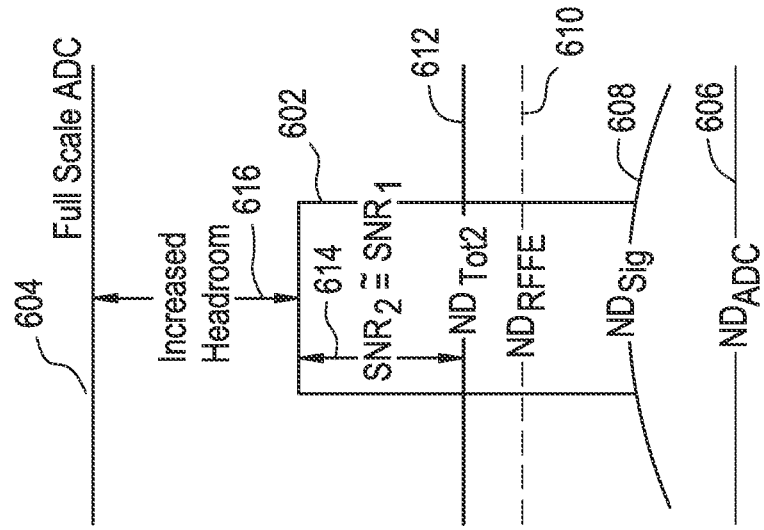
FIG. 5 illustrates the relationship between various noise components of the input to the ADC.

FIG. 5 illustrates the relationship between various noise components of the input to the ADC 206. The incoming signal 201 is shown to have a signal level 502. The ADC full scale value is shown at a level 504. Three noise components are shown. The first is the noise NDAnc 506 generated within the ADC 206. This noise component 506 includes the noise that is due to distortion that occurs in the ADC 206. The second component of noise NDsig 508 is that noise which is received at the input of the LNA 202 together with the signal 201. NDsig 508 includes any distortion that occurs to the incoming signal prior to reception at the input to the LNA 202. The third component of noise NDRFFE 510 is the noise that is generated within the LNA 202 (i.e., RF front end noise and distortion). The sum of these three noise and distortion components is shown as $ND_{10}n$ 512. It will be understood that the difference between $ND_{10}n$ 512 and the incoming signal level 502 is the $SNR_1$ 514, the SNR of the incoming signal 201 to the total noise $ND_{10}n$ 512.

Headroom 516 is defined as the difference between the signal level 502 and the full scale value 504 of the ADC 206. In the case in which a fixed headroom 516 is maintained, the signal level 502 will be controlled by the AGC module 203 to maintain the fixed headroom 516 regardless of the value of the noise components or the SNR.

Figure 6:
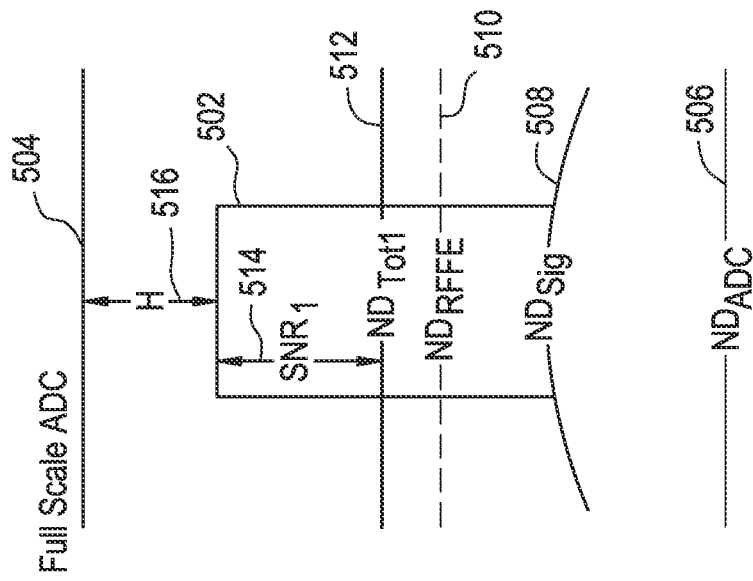
FIG. 6 illustrates the relationship between the headroom, the signal level, and the noise components $ND_{ADC}$, NDsig, NDRFFE, NDtotl of a receiver front end in accordance with one embodiment of the presently disclosed method and apparatus.

FIG. 6 illustrates the relationship between the headroom 616, the signal level 602, and the noise components $ND_{ADC}$ 606, $ND_{Sig}$ 608, $ND_{RFFE}$ 610, $ND_{tot1}$ 612 of a receiver front end 209 in accordance with one embodiment of the presently disclosed method and apparatus. By reducing the gain of the LNA 202, the levels $ND_{Sig}$ 608, $ND_{RFFE}$ 610, $ND_{tot1}$ 612 will each be reduced to some extent. As the AGC Control Module 210 performs its above described functions, the amount of headroom 616 will increase while the $SNR_2$ remains essentially equal to $SNR_1$. Headroom 616 is defined as the difference between the signal level 602 and the full scale value 604 of the ADC 206.

Figure 7:
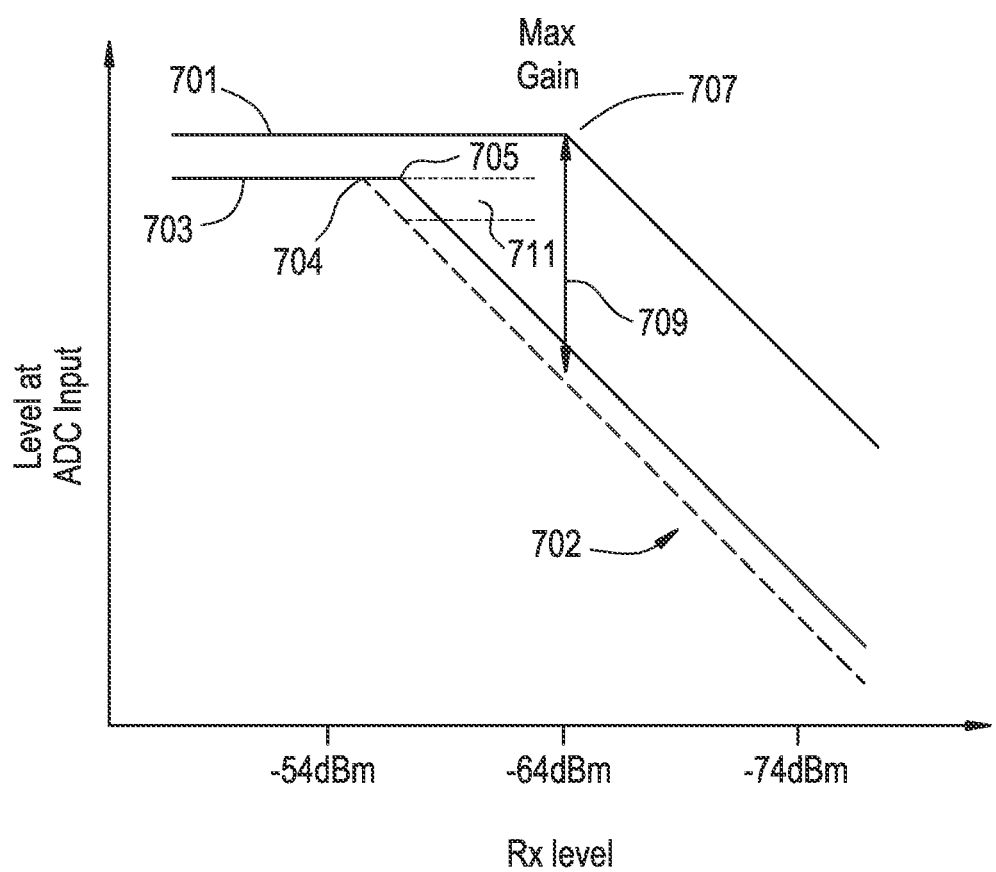
FIG. 7 illustrates the advantages in a receiver's ability to handle burst interference in accordance with the disclosed method and apparatus.

FIG. 7 illustrates the advantages in terms of receiver's ability to handle the burst interference that are achieved by the disclosed method and apparatus. As shown, in systems in which the headroom is maintained at a fixed value, there is substantial wasted dynamic range. However, if the SNR is maintained as relatively constant rather than maintaining the headroom constant for various levels at the input of the ADC 206, this dynamic range is reclaimed.

While various embodiments of the disclosed method and apparatus have been described above, it should be understood that they have been presented by way of example only, and should not limit the claimed invention. Likewise, the various diagrams may depict an example architectural or other configuration for the disclosed method and apparatus. This is done to aid in understanding the features and functionality that can be included in the disclosed method and apparatus. The claimed invention is not restricted to the illustrated example architectures or configurations, rather the desired features can be implemented using a variety of alternative architectures and configurations. Indeed, it will be apparent to one of skill in the art how alternative functional, logical or physical partitioning and configurations can be implemented to implement the desired features of the disclosed method and apparatus. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed method and apparatus is described above in terms of various exemplary embodiments and implementations, it should be understood that the various features, aspects and functionality described in one or more of the individual embodiments are not limited in their applicability to the particular embodiment with which they are described. Thus, the breadth and scope of the claimed invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A receiver front end comprising:
an automatic gain control (AGC) module having an input and an output;
an analog to digital converter (ADC) having an input and an output, the input coupled to the output of the AGC module; and
an AGC control module having an input for receiving information regarding the signal output from the ADC and an output for controlling adjustments to the gain of the AGC module;
wherein the AGC control module determines a signal to noise ratio (SNR) for the signal output from the ADC, controls the gain of the AGC module to maintain the SNR at a desired value, and determines a delta SNR level that is based on a change of the SNR resulting from a change in the gain of the AGC module.

2. The receiver front end of claim 1, wherein:
when the SNR is above a minimum level, then the AGC control module determines whether a delta SNR is above a maximum level, and when the SNR is not above a minimum level, the AGC control module adjusts the gain up; and
when the SNR is above a minimum level and the delta SNR is above a maximum level, the AGC control module adjusts the gain up, otherwise, the AGC module adjusts the gain down.

3. The receiver front end of claim 1, wherein:
when the SNR is above a minimum level, then the AGC control module determines whether a delta SNR is above a maximum level, and if the SNR is not above a minimum level, the AGC control module determines whether there is sufficient headroom to adjust the gain up, and if so, then adjusts the gain up;
when the SNR is above a minimum level and the delta SNR is above a maximum level, the AGC control module determines whether there is sufficient headroom to adjust the gain up and if so, then adjusts the gain up, otherwise, the AGC control module adjusts the gain down.

4. The receiver front end of claim 1, wherein the receiver front end comprises a low noise amplifier (LNA), the output of the LNA being coupled to the input of the AGC module, and wherein the SNR is the ratio of the desired signal level to the level of the noise that is due to distortion that occurs in the ADC, noise that is received at the input of the LNA together with a signal coupled to the input of the LNA and any distortion that occurs to the incoming signal prior to reception at the input of the LNA and any noise generated within the LNA.

5. The receiver front end of claim 1, comprising an analog filter module coupled between the output of the AGC module and the input of the ADC.

6. The receiver front end of claim 2, wherein the determining whether a delta SNR is above a maximum and adjusting the gain of the AGC are repeated.

7. The receiver front end of claim 2, wherein determining whether a delta SNR is above a maximum level includes:
storing a first SNR value;
determining whether a previous SNR value has been stored; and
when a previous SNR value has been stored, then determining the delta SNR by calculating the absolute value of the difference between the previous SNR value and the current SNR value.

8. The receiver front end of claim 3, wherein:
when the SNR is not above a minimum level and there is sufficient headroom, the AGC control module adjusts the gain up, and if either the SNR is above the minimum or there is insufficient headroom, the AGC control module adjusts the gain down.

9. The receiver front end of claim 3, wherein the determining whether a delta SNR is above a maximum level, determining whether there is sufficient headroom to adjust the gain up, and adjusting the gain up or down are repeated.

10. The receiver front end of claim 3, wherein adjustments to increase the gain are equal in size to adjustments to reduce the gain.

11. The receiver front end of claim 3, wherein adjustments to increase the gain are larger than adjustments to reduce the gain.

12. The receiver front end of claim 3, wherein adjustments to increase the gain are smaller than adjustments to reduce the gain.

13. The receiver front end of claim 3, wherein gain adjustments during an acquisition mode are greater than gain adjustments during a maintenance mode.

14. The receiver front end of claim 3, wherein the size of the gain adjustment is based on the number of consecutive times the gain has been adjusted in the same direction.

15. A method for controlling the gain of a receiver front end, comprising:
receiving an input signal;
measuring the signal to noise ratio (SNR) of the output signal
determining a delta SNR level; and
when the SNR is not below a minimum desired level and the delta SNR level is above a minimum, adjusting the gain of an AGC module down using an AGC gain control module; and
repeating the gain adjusting until either the SNR is below a minimum desired level or the delta SNR is above a minimum.

16. The method of claim 15, wherein determining the delta SNR comprises making a first measurement of an SNR before making an adjustment to the gain of the AGC module, making a second measurement of an SNR after making an adjustment to the gain of the AGC module and determining the difference in the SNR between the first and second measurement.

17. The method of claim 15, comprising increasing the gain of the AGC module when either the SNR is below the minimum desired level or the delta SNR level is above a maximum and there is sufficient headroom, and then repeating the method.

18. The method of claim 15, wherein:
when the SNR is above a minimum level, then the AGC control module determines whether a delta SNR is above a maximum level, and when the SNR is not above a minimum level, the AGC control module adjusts the gain up; and
when the SNR is above a minimum level and the delta SNR is above a maximum level, then the AGC control module adjusts the gain up, otherwise, the AGC module adjusts the gain down.

19. The method of claim 15, wherein:
when the SNR is above a minimum level, then the AGC control module determines whether a delta SNR is above a maximum level, and when the SNR is not above a minimum level, the AGC control module determines whether there is sufficient headroom to adjust the gain up, and when so, then adjusts the gain up;

when the SNR is above a minimum level and the delta SNR is above a maximum level, the AGC control module determines whether there is sufficient headroom to adjust the gain up and when so, then adjusts the gain up, otherwise, the AGC control module adjusts the gain down.

20. A method for controlling the gain of a receiver front end, comprising:

receiving an input signal;

measuring a signal to noise ratio (SNR) of the input signal;

when the SNR is not below a minimum desired level, adjusting the gain of an AGC module down, otherwise determining whether there is sufficient headroom and when so, adjusting the gain up;

determining a delta SNR level that is based on a change of the SNR resulting from a change in the gain of the AGC module; and repeating the gain adjusting and delta SNR determining.

* * * * *